United States Patent
Hecht et al.

(10) Patent No.: US 7,593,268 B2
(45) Date of Patent: *Sep. 22, 2009

(54) METHOD FOR ERASING PROGRAMMABLE INTERCONNECT CELLS FOR FIELD PROGRAMMABLE GATE ARRAYS USING REVERSE BIAS VOLTAGE

(75) Inventors: Volker Hecht, Barsinghausen (DE); John McCollum, Saratoga, CA (US); Robert M. Salter, III, Saratoga, CA (US)

(73) Assignee: Actel Corporation, Mountain View, CA (US)

(*) Notice: Subject to any disclaimer, the term of this patent is extended or adjusted under 35 U.S.C. 154(b) by 38 days.

This patent is subject to a terminal disclaimer.

(21) Appl. No.: 11/567,625

(22) Filed: Dec. 6, 2006

(65) Prior Publication Data
US 2007/0091683 A1    Apr. 26, 2007

Related U.S. Application Data

(63) Continuation of application No. 11/171,489, filed on Jun. 29, 2005, now Pat. No. 7,161,841.

(51) Int. Cl.
*G11C 11/34* (2006.01)
(52) U.S. Cl. .............................. 365/185.29; 365/185.28
(58) Field of Classification Search ............ 365/185.28, 365/185.29, 185.14, 185.18, 226, 189.11, 365/189.09
See application file for complete search history.

(56) References Cited

U.S. PATENT DOCUMENTS

| 4,822,750 | A |   | 4/1989  | Perlegos et al. |
|-----------|---|---|---------|-----------------|
| 5,329,487 | A |   | 7/1994  | Gupta et al. |
| 5,640,123 | A | * | 6/1997  | Akaogi et al. ............... 327/534 |
| 5,838,040 | A |   | 11/1998 | Salter, III et al. |
| 6,072,724 | A |   | 6/2000  | Yamazaki |
| 6,125,059 | A |   | 9/2000  | Hecht |
| 6,137,728 | A |   | 10/2000 | Peng et al. |
| 6,191,980 | B1 |  | 2/2001  | Kelley et al. |
| 6,347,054 | B1 |  | 2/2002  | Wang et al. |
| 6,353,555 | B1 |  | 3/2002  | Jeong |
| 6,611,463 | B1 | * | 8/2003 | Mehta et al. ........... 365/185.28 |
| 6,678,190 | B2 |  | 1/2004  | Yang et al. |
| 6,704,221 | B2 |  | 3/2004  | Killat |
| 7,161,841 | B1 |  | 1/2007  | Hecht et al. |
| 2004/0114436 | A1 | | 6/2004 | Hecht et al. |

* cited by examiner

*Primary Examiner*—Anh Phung
(74) *Attorney, Agent, or Firm*—Lewis and Roca LLP

(57) ABSTRACT

A method for erasing a non-volatile memory cell interconnect switch in an FPGA comprised providing an FPGA having a core containing a plurality of non-volatile-memory-cell interconnect switches, each switch formed in a switch well region and coupled to a source/drain of an n-channel transistor formed in a grounded well region separate from the switch well region. A non-volatile memory cell interconnect switch is selected for erasing. The switch well region is disconnected from ground. A VCC potential is applied to the switch well region and to the drain of the n-channel transistor to which it is coupled and an erase potential is applied to the gate of the selected non-volatile memory cell interconnect switch.

6 Claims, 2 Drawing Sheets

US 7,593,268 B2

METHOD FOR ERASING PROGRAMMABLE INTERCONNECT CELLS FOR FIELD PROGRAMMABLE GATE ARRAYS USING REVERSE BIAS VOLTAGE

CROSS-REFERENCE TO RELATED APPLICATIONS

This application is a continuation of U.S. patent application Ser. No. 11/171,489, filed Jun. 29, 2005, now U.S. Pat. No. 7,161,841, issued on Jan. 9, 2007, the entirety of which is hereby incorporated by reference herein.

BACKGROUND OF THE INVENTION

1. Field of the Invention

The present invention relates to programmable integrated circuits. More particularly, the present invention relates to non-volatile-memory-based FPGA integrated circuits such as flash-based FPGA integrated circuits and to methods for erasing the non-volatile memory cells that protect the low-voltage devices coupled to the non-volatile memory cells.

2. Background

An non-limiting example of a cell with which the present invention may be used is described in U.S. patent application Ser. No. 10/319,782, published on Jun. 17, 2004 as Publication Number U.S.-2004-0114436-A1 entitled "PROGRAMMABLE INTERCONNECT CELL FOR CONFIGURING A FIELD PROGRAMMABLE GATE ARRAY."

One method of erasing this cell is to lower the row line voltage to a level of about −16V, while at least one of the two column lines and one of the two source/drain regions of the non-volatile memory switch are grounded. The row line voltage is limited to about 16V, due to the device breakdown limits of the row-access circuits. The non-volatile memory switch has to be grounded, since most non-volatile memory switches are tied to core logic or the core power or ground, while the core power has to be shut down and grounded during the erase operation.

As shown in FIG. 1, the core power is shut down by a power switch circuit at the chip-internal core supply voltage $V_{CCL}$, which disconnects the core supply node $V_{CCL}$ at reference numeral 10 from the external $V_{CC}$ to ground instead. This is shown implemented by utilizing inverter 14 coupled between $V_{CC}$ and ground. Inverter 14 includes p-channel MOS transistor 16 n-channel MOS transistor 18 and is driven by the signal CORE OFF 20. During normal circuit operation, the CORE OFF signal 20 is maintained at a low logic level, which causes the output of inverter 12 to assume a high logic level of $V_{CCL}$. The output of inverter 14 drives the $V_{CCL}$ node 10 to power the core circuits associated with memory cell 22 in FPGA core 12.

For purposes of illustration, an inverter comprised of p-channel transistor 24 and n-channel transistor 26 is shown having its output coupled through non-volatile memory-cell transistor 22 to drive a circuit node (not shown). The bulk of the p-channel transistor 24 is coupled to the $V_{CCL}$ node and the bulks of the n-channel transistor 26 and the non-volatile memory transistor 22 are coupled to ground.

During programming of the non-volatile memory-cell transistor 22 the CORE OFF signal 20 is maintained at a high logic level. This causes the output of inverter 14 to assume a low logic level of ground and removes to $V_{CCL}$ potential from the core circuits (the inverter comprising transistor 24 and 26) associated with memory cell 22.

Persons of ordinary skill in the art will observe that the maximum voltage differential between the column-line and non-volatile memory cell transistor source/drain voltage to the row line voltage at the gate of non-volatile memory cell transistor 22 is limited to 16V. Using this erase potential requires long erase times to achieve the target erase window. Shorter erase times can be achieved by increasing this voltage differential, however, bringing the gate voltage more negative will risk damage or malfunction of the high voltage program/erase transistor (i.e., the row decoders).

BRIEF DESCRIPTION OF THE INVENTION

A method for erasing a non-volatile memory cell interconnect switch in an FPGA comprises providing an FPGA having a core containing a plurality of non-volatile-memory-cell interconnect switched, each switch formed in a switch well region and coupled to a source/drain of an n-channel transistor formed in a grounded well region separate from the switch well region. A non-volatile memory cell interconnect switch is selected for erasing. The switch well region is disconnected from ground. A $V_{CC}$ potential is applied to the switch well region and to the drain of the n-channel transistor to which it is coupled and an erase potential is applied to the gate of the selected non-volatile memory cell interconnect switch.

BRIEF DESCRIPTION OF THE DRAWINGS FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

The present invention is a new method of erasing the interconnect non-volatile memory cell, by increasing the column-line and source/drain voltage of the switch to the logic supply voltage, which is e.g. typically 1.5V or 1.2V in a 0.13u technology or about 2.5V in a 0.25u technology. The invention requires providing a chip internal core ground node GNDL, which connects to all source areas of the n-channel transistor of all logic circuits in the core as well as to the high-voltage n-well node of the flash FPGA array. All substrate connections in the core logic still need to be connected to the chip-external GND node. The invention also requires a power switch at chip internal core ground node GNDL, which disconnects the chip-internal GNDL node to the external $V_{CC}$ core supply voltage. The invention furthermore requires the column lines to be forced to the $V_{CC}$ voltage during erase, which becomes possible as the array-n-well node (i.e., the high-voltage n-well node of the flash FPGA array) is tied to GNDL and forced to $V_{CC}$ as well during erase.

Figure 1:
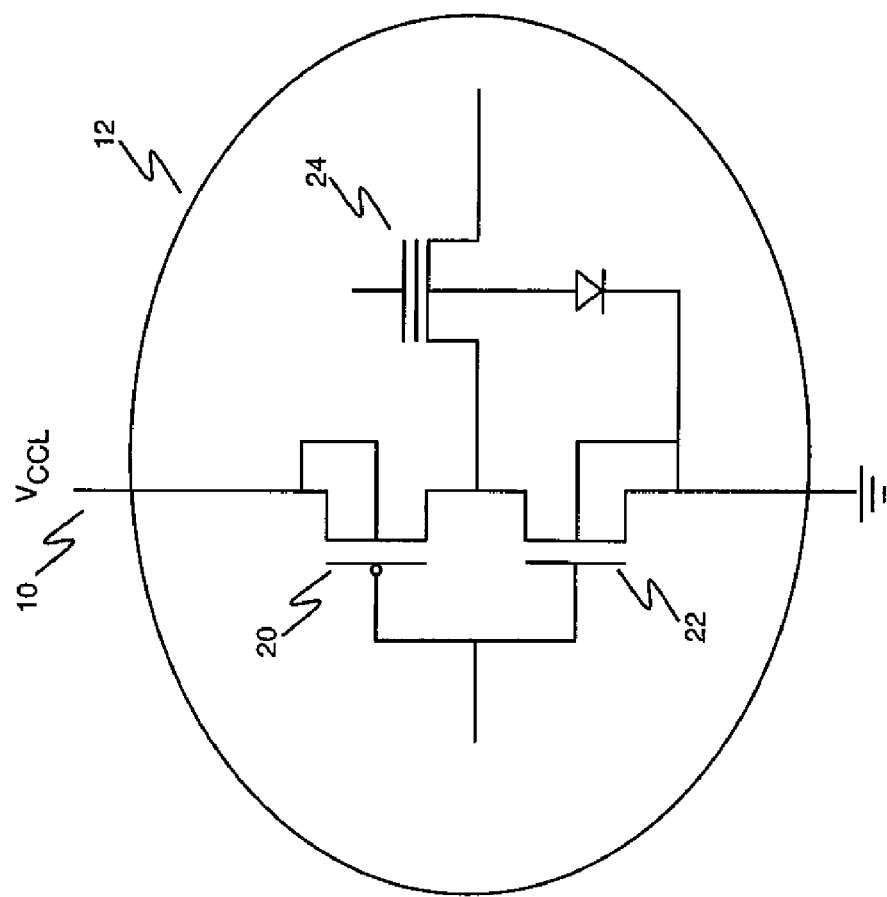
FIG. 1 is a schematic diagram of a portion of the core circuitry in a prior-art non-volatile-memory-based FPGA showing a method for programming and erasing the non-volatile memory cell.
Figure 1:
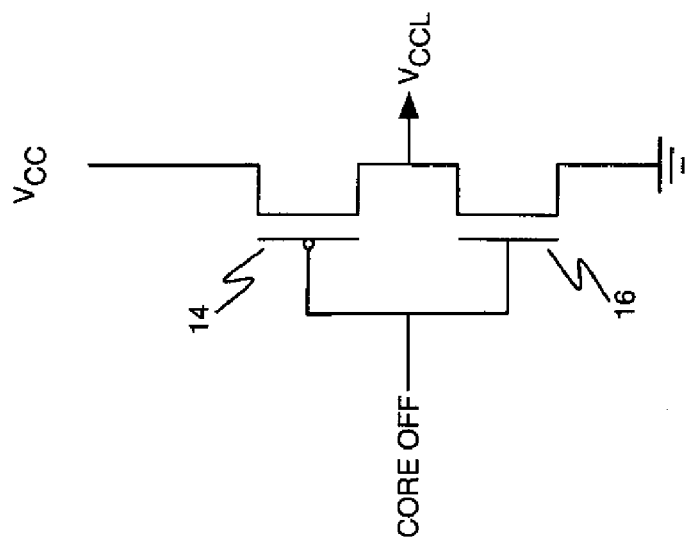
Figure 2:
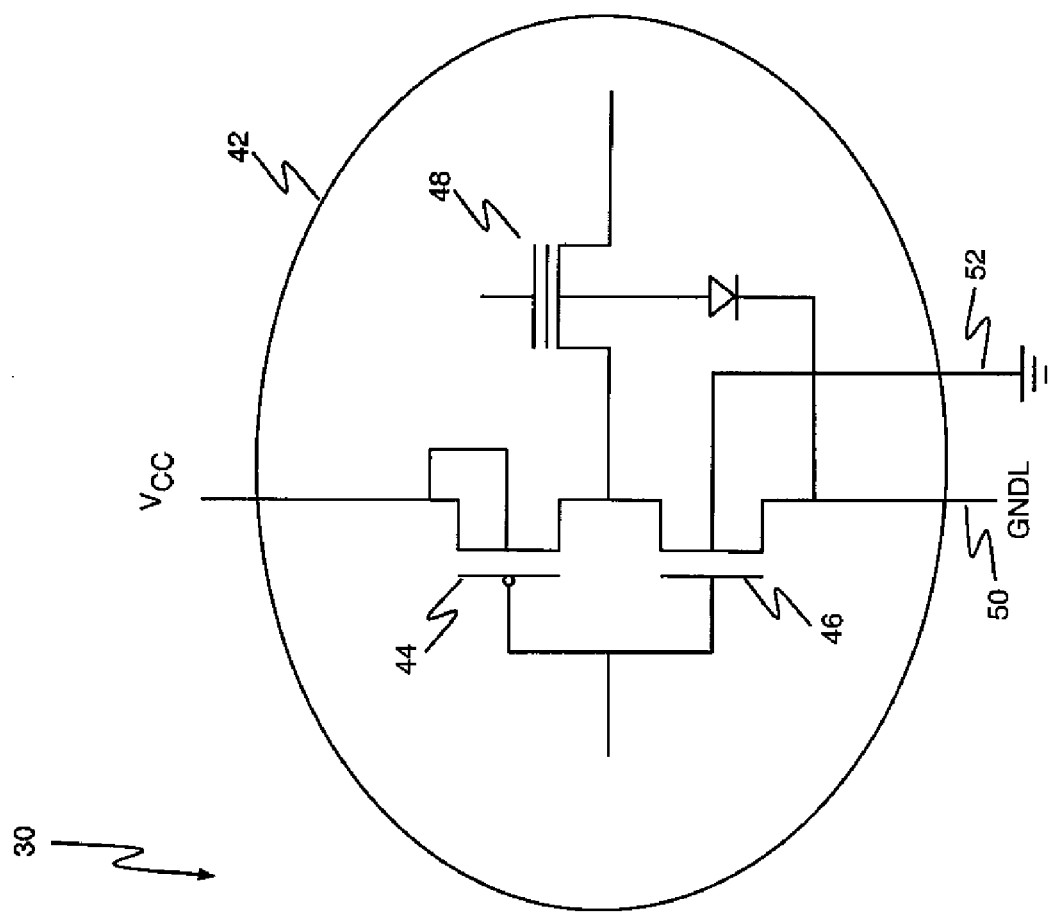
FIG. 2 is a schematic diagram of a portion of the core circuitry in a non-volatile-memory-based FPGA showing a method according to the present invention for programming and erasing the non-volatile memory cell.
Figure 2:
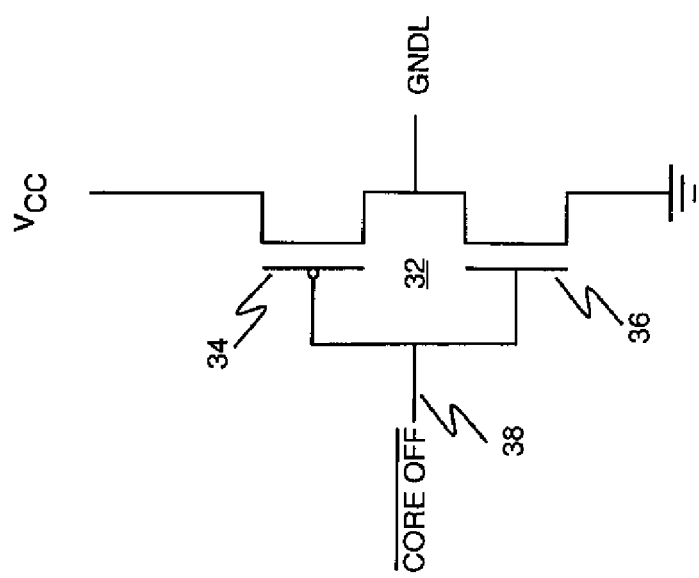

Referring now to FIG. 2, an exemplary circuit 30 for implementing the method of the present invention is shown. Persons of ordinary skill in the art will recognize that the circuit of FIG. 2 is used to control a single non-volatile switch in an FPGA having many such non-volatile switches.

Circuit 30 includes a GNDL switch in the form of an inverter 32 comprising p-channel transistor 34 and n-channel transistor 36. The source of n-channel transistor 36 is coupled to the external GND node of the chip. A CORE OFF! control line 38 is driven by a CORE OFF! Signal. When the control signal is not asserted, the CORE OFF! control line 38 is at a high logic level and the output of inverter 32 is at ground. When the control signal is asserted, the CORE OFF! control line 38 is at a low logic level and the output 40 of inverter 32 is at $V_{CC}$. The control signal CORE OFF! control signal controls the voltages at the p-wells of many non-volatile switched in the FPGA core.

A portion of the FPGA core of the chip including a single non-volatile switch portion of a two-transistor non-volatile memory cell is indicated at reference numeral 42. An inverter (representing the core logic circuitry) comprising p-channel transistor 44 and n-channel transistor 46 is shown disposed in core 42. This inverter is part of the FPGA logic circuitry and may be coupled to another circuit node inside the core by programming the non-volatile memory cell 48 to which its output is coupled. Persons of ordinary skill in the art will appreciate that other devices such as a transmission gate could be coupled to non-volatile memory cell 48, via a source/drain terminal.

The source of the p-channel transistor 44 in the inverter is coupled to the chip $V_{CC}$ node as is the n-well in which it is formed. The source of n-channel transistor 46 in the inverter is coupled to the GNDL node 50. The n-well containing the p-well in which the non-volatile memory transistor 48 is formed is coupled to ground during normal operation and is coupled to a potential of at least $V_{CC}$ during erasing. The p-well in which the n-channel transistor 46 is formed is coupled to the external GND node 52 of the chip (the substrate). Persons of ordinary skill in the art will realize that there will be may core-circuit portions 42 in any given integrated circuit, each having a GNDL node coupled to the output of inverter 32.

During normal operation of the FPGA, the CORE OFF! signal is high (unasserted) and the GNDL node 50 of the core is grounded through n-channel transistor 36 of the control inverter 32. When it is desired to program the non-volatile memory cell 48, the CORE OFF! signal is asserted (brought low 0 and the GNDL node 50 of the core is raised to $V_{CC}$ through p-channel transistor 34 of the control inverter 32. The row line voltage at the gate of the non-volatile memory transistor is placed at about −16 volts. For any non-volatile memory transistor in the array that is not to be programmed, the row-line voltage is set to between about 0 volts and less than about −8 volts. This is places the drain of the n-channel transistor 46 of the inverter (or the source/drain terminal of a transmission gate, etc) at $V_{CC}$.

As can be seen from an examination of FIG. 2 and the accompanying explanation, the advantage of the present invention is the increased voltage differential between the column line (gate) and the source/drain voltage and p-well voltage of the non-volatile memory transistor 48. In the case of a 1.5V $V_{CC}$ voltage, this increase is from 16V to 17.5V. The additional 1.5V allows reduction of the erase time by a factor of approximately 10-100 to achieve a larger erase window using the original erase pulse timing.

While the exemplary embodiment of the invention shown in FIG. 2 shows a floating gate MOS transistor used as the non-volatile switch, persons of ordinary skill in the art will appreciate that the present invention is useful for any non-volatile memory technology that uses voltages higher than $V_{CC}$ for programming and erasing.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for operating a non-volatile memory switch in an FPGA integrated circuit including a first p-well region coupled to ground; an n-channel MOS transistor disposed in the first p-well region, a second p-well region disposed within an n-well and electrically isolated from the first p-well region, and a non-volatile memory switch disposed in the second p-well region, the non-volatile memory switch having a source/drain region coupled to a drain of the n-channel MOS transistor, a source coupled to the second p-well, and a gate, the method comprising;

coupling the second p-well to ground when the integrated circuit is in an operating mode and to $V_{CC}$ when the integrated circuit is in a mode in which the non-volatile memory switch is to be erased; and coupling the n-well containing the second p-well to a potential of at least $V_{CC}$ when the integrated circuit is in a mode in which the non-volatile memory switch is to be erased.

2. The method of claim 1 wherein coupling the n-well containing the second p-well to a potential of at least $V_{CC}$ when the integrated circuit is in a mode in which the non-volatile memory switch is to be erased comprises coupling the n-well containing the second p-well to a potential of at least $V_{CC}$ through an inverter having an output coupled to the second p-well and an input coupled to a CORE-OFF control signal.

3. The method of claim 2 further including:

entering a programming mode;

coupling the second p-well to $V_{CC}$ and the gate of the non-volatile memory switch to a negative programming potential when the non-volatile memory switch is to be programmed; and coupling the second p-well to $V_{CC}$ and the gate of the non-volatile memory switch to a potential that is less negative than the negative programming potential when the non-volatile memory switch is not to be programmed.

4. The method of claim 3 wherein coupling the n-well containing the second p-well to $V_{CC}$ when the integrated circuit is in the programming comprises coupling the n-well containing the second p-well to $V_{CC}$ through an inverter having an output coupled to the second p-well and an input coupled to a CORE-OFF control signal.

5. A method for operating an FPGA integrated circuit including a logic circuit in an FPGA core including an inverter having an n-channel MOS transistor formed in a first p-well that is coupled to ground, the inverter having an output programmably driving a logic-circuit node through an n-channel non-volatile switch formed in a second p-well and coupled to a switchable node, a source of the n-channel MOS transistor in the inverter coupled to the switchable node, the method including:

coupling the switchable node to a node-switching circuit;

operating the node-switching circuit to ground the switchable node during logic circuit operation; and operating the node-switching circuit to connect the switchable node to $V_{CC}$ during a programming operation and during an erase operation.

6. The method of claim 5 wherein coupling the switchable node to a node-switching circuit comprises coupling the switchable node to a node-switching circuit including an inverter having an input coupled to a node-switching control signal and an output coupled to the switchable node.

* * * * *